Figure 1A:
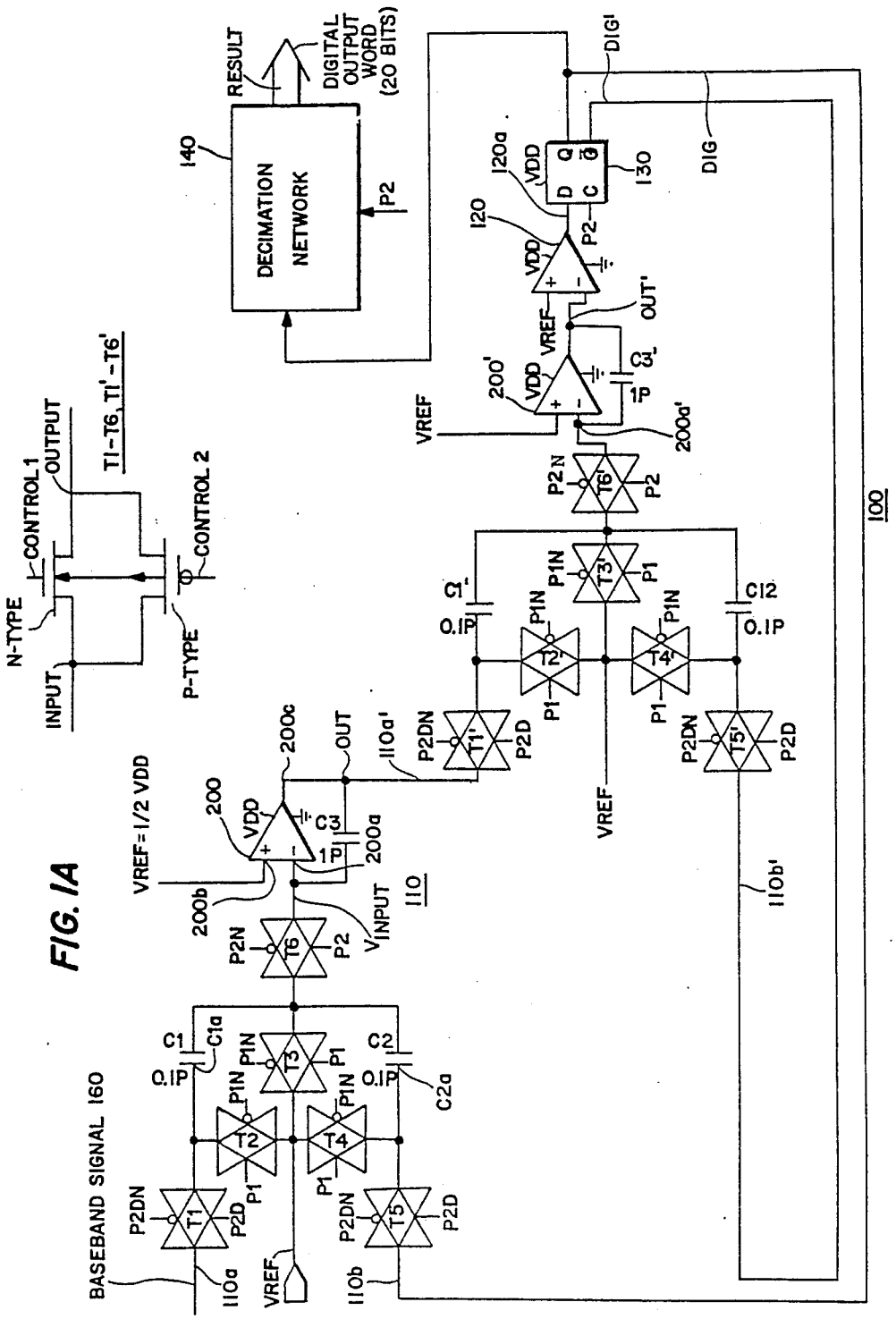

United States Patent [19]

Sauer

[11] Patent Number: 4,837,527
[45] Date of Patent: Jun. 6, 1989

[54] SWITCHED CAPACITOR ARRANGEMENT

[75] Inventor: Donald J. Sauer, Allentown, N.J.

[73] Assignee: RCA Licensing Corporation, Princeton, N.J.

[21] Appl. No.: 137,230

[22] Filed: Dec. 23, 1987

[51] Int. Cl.$^4$ .............................................. H03K 7/00
[52] U.S. Cl. ..................................... 332/11 D; 375/28; 341/167; 341/172
[58] Field of Search ............. 332/11 D; 340/347 AD; 375/27, 28; 341/143, 167, 168, 172

[56] References Cited

U.S. PATENT DOCUMENTS

| | | | |
|---|---|---|---|
| 3,614,645 | 10/1971 | Wheatley | 330/30 D |
| 4,600,901 | 7/1986 | Rabaey | 332/11 D |
| 4,625,155 | 11/1986 | Dietz | 315/408 |

OTHER PUBLICATIONS

A technical paper entitled THAM 11.5: A 120 KHZ Signal Delta A/D Converter, published in ISSCC Digest of Technical Papers, pp. 138–139; Feb., 1986, in the names of R. Koch, et al.
An article published in IEEE Transactions on Communications, vol. Com-33, No. 3, Mar. 1985, entitled, A Use of Double Integration in Sigma Delta Modulation, in the name of James C. Candy.
A textbook entitled Switched Capacitor Circuits, in the names of Philip E. Allen and Edgar Sanchez-Sinencio, dated 1984, p. 94 and cover page.
An article published in IEEE Transactions on Circuits and Systems, vol. Cas -25, No. 7, Jul. 1978 entitled, A Sigma-Delta Modulator as an A/D Converter, in the name of Rudy J. Van DePlassche.
U.S. Application Ser. No. 137,229 entitled, A Modified Cascode Amplifier, in the Name of Doanld Sauer that was Filed Concurrently Herewith.

*Primary Examiner*—William M. Shoop, Jr.
*Assistant Examiner*—Marc S. Hoff
*Attorney, Agent, or Firm*—Eugene M. Whitacre; Joseph J. Laks; Sammy S. Henig

[57] ABSTRACT

An integrator of a Sigma-Delta modulator includes an amplifier having an inverting input terminal and an output terminal. AN integrating capacitor is coupled between the input and output terminals. An input signal is coupled via a switched capacitor arrangement to the input terminal. The switched capacitor arrangement includes first and second transmission gates, operating at a first frequency, and a second capacitance that are coupled in series. In each period of the operation of the transmission gates, the first transmission gate is turned off before the second transmission gate for preventing a charge injected by the second transmission gate when the second transmission gate is turned off from being coupled to the input terminal of the amplifier.

19 Claims, 3 Drawing Sheets

L = CHANNEL LENGTH IN MICRONS
W = CHANNEL WIDTH IN MICRONS

SWITCHED CAPACITOR ARRANGEMENT

The invention relates to a switched capacitor arrangement for use in, for example, a signal integrator of a Sigma-Delta ($\Sigma\Delta$) modulator.

In, for example, a stereo decoder that utilizes digital techniques, an analog-to-digital (A/D) converter is used for converting an analog, baseband stereo signal to a digital output signal. The digital output signal is processed in the stereo decoder to form a pair of decoded audio signals that are, generally, referred to as the left channel audio signal and the right channel audio signal, respectively.

A baseband stereo signal that is in accordance with, for example, the BTSC standard, may have a bandwidth of 75 KHz. Therefore, the A/D conversion rate required has to be higher than the minimum required by the Nyquist sampling criteria such as, for example, 200 KHz. In order to obtain a minimum predetermined signal-to-noise ratio the quantization resolution in the output word of the A/D converter may have to be, for example, 20 bits.

In an arrangement embodying the invention, the A/D converter operates as a $\Sigma\Delta$ A/D converter that utilizes, advantageously, the metal-oxide-semiconductor (MOS) technology such as, for example, the CMOS technology. The CMOS technology provides, advantageously, relatively high speed operation with lower power consumption.

A typical $\Sigma\Delta$ A/D converter includes a signal integrator stage responsive to a sum signal. The sum signal is formed by the summation of an analog input signal and an internally generated bilevel analog signal. An output signal of the signal integrator is coupled to an input terminal of a threshold detector that generates a bilevel digital signal having a first state when the output signal of the integrator is smaller than a first predetermined level and having a second state, otherwise. The signal generated by the threshold detector is stored in a flip-flop at a predetermined rate. The output signal from the flip-flop is used for generating the bilevel analog signal portion of the sum signal.

A signal integrator, embodying an aspect of the invention, is constructed using the switched capacitor technique that is advantageous when CMOS technology is used. It includes an amplifier and a signal integrating capacitor coupled between an inverting input terminal and an output terminal of the amplifier.

The switched capacitor arrangement includes a first transmission gate, a second capacitance and a second transmission gate that form a series arrangement for alternately coupling an input signal to, and for decoupling the input signal from the inverting input terminal of the amplifier. First and second control signals are coupled to the first and second transmission gates, respectively, for controlling the switching times of the corresponding transmission gates such that during a first portion of a period of, for example, the first control signal both transmission gates are conductive and during a second portion of the period both are nonconductive.

During the turn-off transition of such transmission gate, a charge may be coupled from transistors of the transmission gate to an output terminal of the transmission gate. Such charge may be nonlinearly dependent on the voltage at the input terminal, as explained later on. When such transmission gate is used for applying the input signal to the integrating capacitance, such charge, may be nonlinearly dependent on the level of the input signal. If permitted to be coupled to the integrating capacitance, such charge may, disadvantageously, cause the linearity of the signal integrator to degrade.

In accordance with an aspect of the invention, a signal integrator includes a source of an input signal, a first capacitance and a first transmission gate having a control terminal that is responsive to a bilevel, first control signal. The first transmission gate has a first signal terminal that is coupled to a first terminal of the first capacitance and a second signal terminal that is coupled to the source of input signal. The signal integrator includes an amplifier having an input terminal and an output terminal. A second transmission gate has a control terminal that is responsive to a bilevel, second control signal. The second transmission gate has a first signal terminal that is coupled to the first input terminal of the amplifier and a second signal terminal that is coupled to a second terminal of the first capacitance. The input signal is coupled to the first input terminal of the amplifier via the series arrangement of the first transmission gate, the first capacitance and the second transmission gate. The first and second transmission gates are timed to operate in accordance with the first and second control signals, respectively. An integrating, second capacitance is coupled between the input and output terminals of the amplifier for developing an output signal at the output terminal of the amplifier that is representative of a time integral of the input signal. The first control signal is delayed relative to the second control signal for rendering, in a given period of the second control signal, the second transmission gate nonconductive prior to a time when the first transmission gate becomes nonconductive thereby to prevent signal associated with a transition of the first control signal turning off of the first transmission gate from being coupled to the input terminal of the amplifier.

Figure 1B:
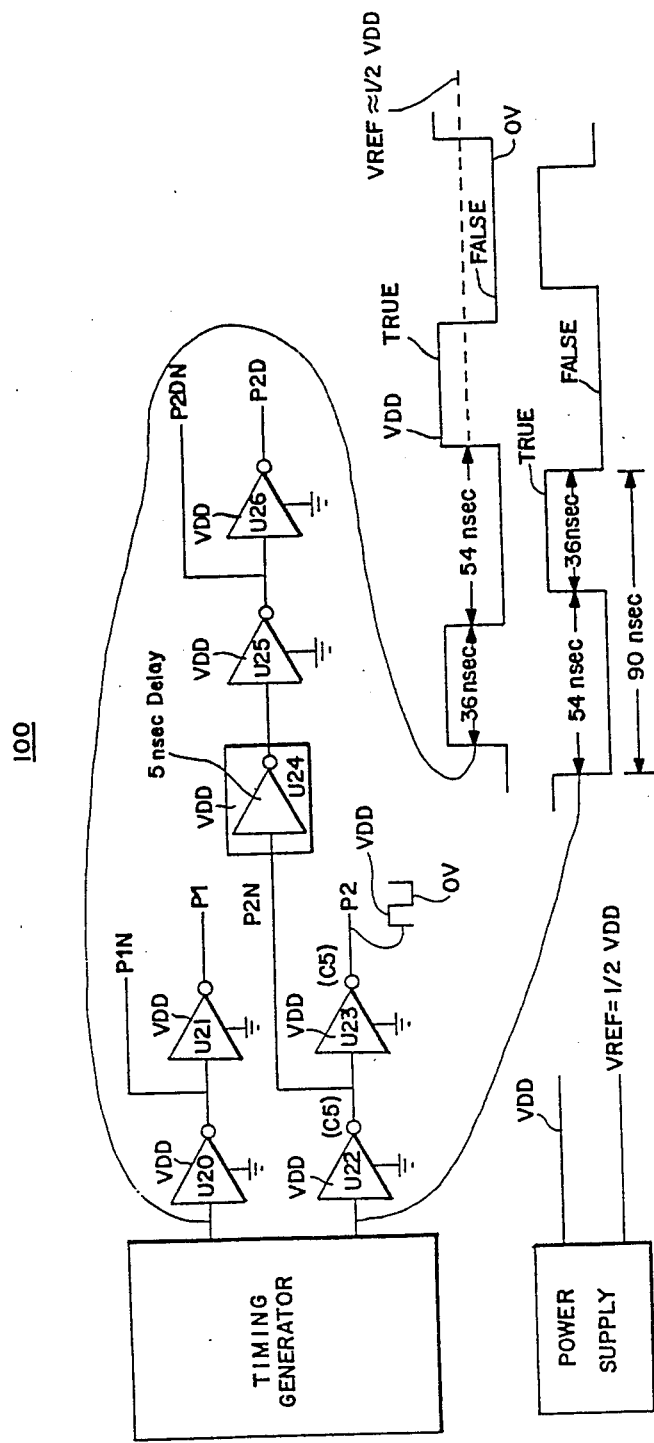
Figure 2:
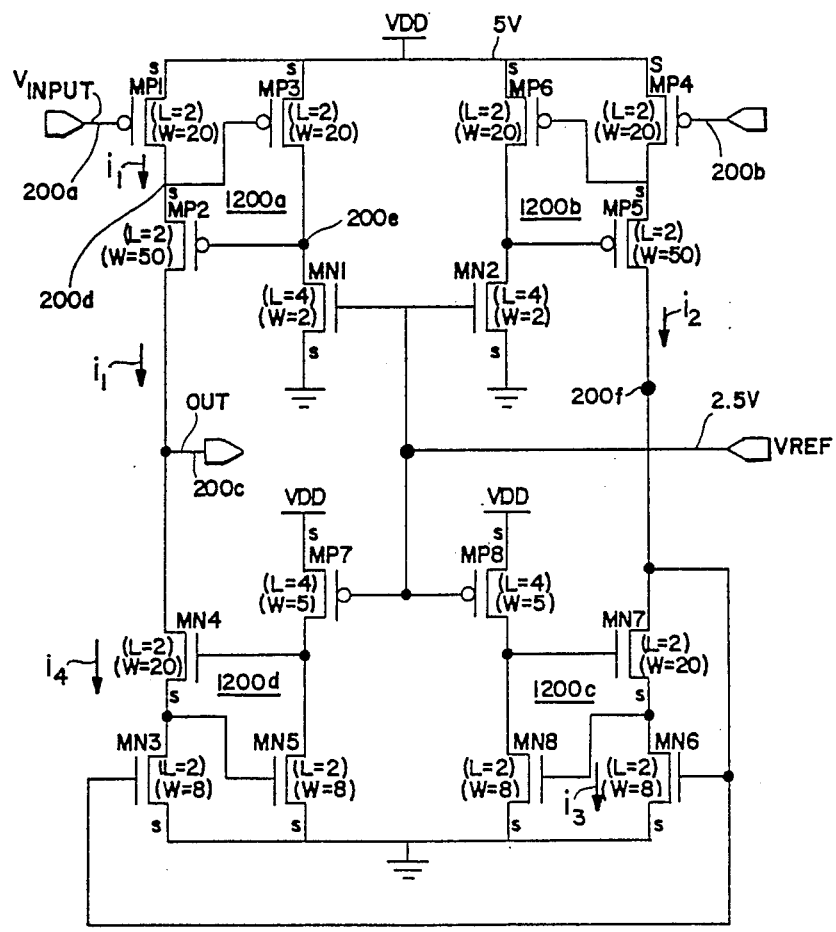

FIGS. 1A and 1B that form FIG. 1 illustrate a schematic diagram of a Sigma-Delta A/D converter that includes a signal integrator, embodying an aspect of the invention; and FIG. 2 illustrates the detailed schematic of an amplifier, that is included in the signal integrator of FIG. 1.

FIG. 1 illustrates a $\Sigma\Delta$ A/D converter 100, embodying an aspect of the invention. A/D converter 100 includes a signal integrator 110 that utilizes the switched capacitor circuit technique. Signal integrator 110 receives an analog input signal 160 that is to be converted to its digital equivalent at an input terminal 110a and receives an internally generated bilevel signal DIG at a terminal 110b. Integrator 110 provides a signal OUT at an output terminal 200c of an amplifier 200. Input signal 160 may be, for example, a baseband stereo signal generated by, for example, an FM decoder of a television receiver, not shown in the FIGURES, that is in accordance with, for example, the BTSC standard. Amplifier 200 has an inverting input terminal 200a. An integrating capacitor C3 is coupled between terminals 200c and 200a. A noninverting input terminal 200b is coupled to a DC voltage VREF. The closed loop response of the amplifier and feedback capacitor tends to establish the potential at the inverting input 200a of amplifier 200 at the level of voltage VREF.

Input signal 160 at terminal 110a is coupled to a first terminal C1a of a capacitor C1 via, for example, a conventional complementary transistor transmission gate T1. Transmission gate T1 that utilizes the CMOS technology is controlled by complementary clock signals P2D and P2DN causing the corresponding pair of transistors of transmission gate T1 to be conductive when signal P2D is TRUE, or high. The other terminal of capacitor C1 is coupled through a transmission gate T6 to the inverting input terminal 200a of amplifier 200. Transmission gate T6 is controlled by complementary clock signals P2 and P2N causing it to be conductive when signal P2 is TRUE, or high. Transmission gates T1 and T6 are conductive simultaneously during a first portion of each period of, for example, signal P2D and are both nonconductive during a second portion of it. Thus, transmission gates T1 and T6 operate at the frequency of signal P2D that is, for example, 11 MHz.

Terminal C1a of capacitor C1 is also coupled to voltage VREF through a transmission gate T2, when transmission gate T2 is conductive. The other terminal of capacitor C1 is coupled to voltage VREF through a transmission gate T3, when transmission gate T3 is conductive. Transmission gates T2 and T3 are controlled by clock signals P1 and P1N and operate at the same frequency as signal P2D. When transmission gates T2 and T3 are conductive, transmission gates T1 and T6 are not, and vice versa.

Bilevel signal DIG, generated in a manner that is described later on, is coupled to terminal 110b of integrator 110. Terminal 110b is coupled via a transmission gate T5 to a terminal C2a of a capacitor C2. Transmission gate T5 is controlled by complementary clock signals P2D and P2DN causing it to be conductive when clock signal P2D is high. The other terminal of capacitor C2 is coupled to a junction terminal between transmission gates T6 and T3. Terminal C2a is coupled to voltage VREF via a transmission gate T4 when it is conductive. Transmission gate T4 is controlled by clock signals P1 and P1N. Transmission gates T4 and T5 operate similarly to, and simultaneously with, transmission gates T2 and T1, respectively.

In accordance with an aspect of the invention, clock signals P2D and P2DN that control transmission gates T1 and T5 are similar to, but delayed by approximately 5 nsec from, clock signals P2 and P2N, respectively. Each of signals P1, P2 and P2D is a bilevel signal having a waveform of, for example, 40% duty cycle and a period of, for example, approximately 90 nsec. When signal P1 is at a TRUE or high state, signal P2 is always at a FALSE or low state such that signals P1 and P2 are nonoverlapping signals. The result is that when transmission gates T1, T5 and T6 are conductive, transmission gate T2, T3 and T4 are not, and vice versa.

In operation, transmission gate T2, T3 and T4 are simultaneously rendered conductive, during a first portion of each period of, for example, clock signal P1, to discharge capacitors C1 and C2. The potential on the respective electrodes of capacitors C1 and C2 is established at that of voltage VREF, which is substantially equal to the potential at the inverting input terminal 200a of amplifier 200 (±the amplifier input offset potential). Transmission gates T2, T3 and T4 are then rendered non-conductive and transmission gates T1, T5 and T6 conductive. Input terminal 200a is maintained at a virtual AC ground because of the amplifier feedback connection. Thus capacitors C1 and C2 charge to the respective input voltages at terminals 110a and 110b. The charging current is integrated in capacitor C3, producing an output signal OUT that is proportional to the time integral of the sum of the two input signals at terminals 110a and 110b.

The N-channel and P-channel MOS transistors of a given transmission gate such as shown in FIG. 1A are coupled in parallel and require opposing clock signals. Signal feedthrough to an output terminal OUTPUT of such transmission gate due to the clock will be reduced as a result of cancellation. However, the cancellation is not complete.

Moreover, disadvantageously, the level of the uncancelled feedthrough signal is nonlinearly dependent on the voltages at the signal terminals INPUT and OUTPUT of such transmission gate. The voltage dependency is caused because, for example, the charge stored in the inversion layer of each of the MOS transistors of such transmission gate, when the transmission gate is conductive, is nonlinearly dependent on the voltages at terminals INPUT and OUTPUT. A voltage change in a given direction in, for example, input terminal INPUT may cause the charge in the inversion layer of one of the complementary transistors to increase by a corresponding amount and in the other one to decrease by a different amount such that the difference between the charge increase and decrease is nonlinearly dependent on the voltage at terminal INPUT.

A corresponding portion of the charge stored in the inversion layer in each of the complementary transistors is coupled to terminal OUTPUT during the turn-off transition of the transmission gate. Thus, a net charge, that is equal to the difference between the corresponding portions of the charges in each of the complementary transistors of, for example, transmission gate T1, is coupled to the corresponding terminal OUTPUT. In the operation of transmission gate T1, the net charge may be transferred to capacitor C1 during the transition edges of clock signals P2D and P2DN that cause transmission gate T1 to be turned off. Such net charge is nonlinearly dependent on the voltage at its input terminal INPUT that is equal to input signal 160. If such net charge is permitted to be coupled to integrating capacitance C3, it will cause, disadvantageously, linearity degradation in the operation of, for example, signal integrator 110.

In accordance with an aspect of the invention, to prevent such linearity degradation, transmission gate T6 that is controlled by clock signals P2 and P2N is, advantageously, turned off approximately 5 nanoseconds prior to the time transmission gates T1 and T5 are turned off. Thus, advantageously, such net charge transfer in, for example, transmission gate T1 will be prevented by transmission gate T6, that is then already non-conductive, from affecting signal OUT.

If the steady state again of amplifier 200 is high and if integrator 110 achieves steady state operation prior to the turn-off transition of transmission gate T6, the net charge coupled by transmission gate T6 during its turn-off transition, advantageously, will not degrade the linearity of integrator 110. This is so, because such net charge will not be dependent on the level of signal 160 since corresponding voltages at each of the signal terminals of transmission gate T6 are at the same constant level that is approximately equal to voltage VREF.

On the other hand, as a result of, for example, a relatively high rate of change of input signal 160, steady state operation may not occur immediately prior to the turn-off of transmission gate T6. Therefore, the voltages at the signal terminals of transmission gate T6, immediately prior to its turn-off time, may be different in accordance with the level of input signal 160 that exists at such turn-off time. In such situation, the net charge that is coupled to terminal OUTPUT of transmission gate T6 may be, disadvantageously, nonlinearly dependent on input signal 160. It is desirable to reduce the nonlinear voltage dependent effect on the net charge in transmission gate T6.

In accordance with another aspect of the invention, the nonlinearity in the voltage dependency of the net charge is reduced by operating the two transistors in a symmetrical manner. Symmetrical operation of the transistors of transmission gate T6 means that each of the complementary transistors of the transmission gate, contain substantially the same charge at least immediately before gate turn-off. Symmetrical operation is accomplished by biasing the circuitry so that the input and output terminals of the between transmission gate tend to be biased midway the complementary potentials of the clock signal that are applied to the gate electrodes.

To accomplish the symmetrical operation, voltage VREF that is coupled to noninverting terminal 200b is established at a level that is equal to the midpoint of the two levels of for example, clock signal P2. In this way, voltage $V_{input}$, that is developed at output terminal OUTPUT of transmission gate T6, is also established at the level of voltage VREF as a result of the feedback. The input terminal of transmission gate T6 follows the potential at its output terminal because it is operating as a relatively low impedance switch.

Since the two transistors of transmission gate T6 operate symmetrically and have similar characteristics, a change in the net charge that is produced by a given change in the voltage at, for example, its output terminal OUTPUT will be, advantageously, smaller than if they did not operate symmetrically. Therefore, the net change will also be, advantageously, less nonlinearly dependent on the level of input signal 160.

A signal DIG', having an inverted waveform of that of signal DIG, and signal OUT are coupled to input terminals 110b' and 110a' of a second signal integrator 110' that operates similarly to integrator 110. Similar items and functions in integrators 110 and 110' are depicted by similar numerals and symbols. Integrator 110' generates an output signal OUT' that is proportional to the time integral of a sum of signal OUT from integrator 110 and of signal DIG'.

Signal OUT' is coupled to an input terminal of a comparator 120 that generates a digital, bilevel signal 120a. Signal 120a is at a TRUE state when signal OUT' is below a predetermined threshold level that is substantially equal to voltage VREF and at a FALSE state, otherwise. Bilevel signal 120a is clocked into a "D" type or data flip-flop 130 by the falling edge of clock signal P2. Flip-flop 130 produces complementary signals DIG and DIG' at its corresponding output terminals at states that correspond with the state of signal 120a. Because the falling edge of signal P2 simultaneously causes both the clocking of flip-flop 130 and the turn-off of transmission gates T6 and T6', the transient peturbations that may be associated with the turning-off of transmission gate T6 and T6', advantageously, are prevented from affecting signals DIG and DIG'. Signal DIG is coupled to integrator 110 in a negative feedback manner; similarly, signal DIG' is coupled to integrator 110' in a negative feedback manner.

Signal DIG may be at one of its TRUE and FALSE states in each period of, for example, signal P2. When signal DIG is at the TRUE or high state, it is larger than voltage VREF. On the other hand, when it is at the FALSE or low state it is smaller than voltage VREF. Thus, in a given period of signal P2, if signal DIG is at the TRUE state, it causes signal OUT to decrease. On the other hand, if signal DIG is at the FALSE state, it causes signal OUT to increase. Thus, signals DIG provides negative feedback in such a way so as to form a first portion of the current in capacitor C2 that has an average value that is equal to, but of the opposite polarity of, a second portion of the current in capacitor C2 that is caused by signal 160. Consequently, when input signal 160 causes signal OUT of integrator 110, for example, to increase, signal DIG causes it to decrease, and vice versa, in a negative feedback manner. Similarly, in integrator 110', when signal OUT causes signal OUT', for example, to increase, signal DIG' causes it to decrease, and vice versa, in a negative feedback manner. The advantages in using double integration such as formed by integrators 110 and 110' is described in, for example, an article entitled, A USE OF DOUBLE INTEGRATION IN SIGMA DELTA MODULATION, in the name of James C. Candy, published in IEEE TRANSACTIONS ON COMMUNICATIONS Vol. COM-33, No. 3, March 1985.

Signal DIG is coupled to a decimation network 140 that generates a parallel word RESULT, providing the digital representation of analog input signal 160. An example of such decimation network is described in, for example, an article entitled A Sigma-Delta Modulator As An A/D Converter, in the name of Rudy J. Van De Plassche, published in IEEE TRANSACTION ON CIRCUIT AND SYSTEMS, Vol. CAS-25, No. 7, July 1978. Parallel word RESULT of decimation network 140, may be formed, in accordance with the teaching of Van De Plassche, by computing a difference between the number of periods of, for example, signal P2, occurring during a predetermined interval N, when signal DIG is at the TRUE state and the number of such periods of signal P2, during interval N, when signal DIG is at the FALSE state. Interval N is selected in accordance with the bit resolution of word RESULT that is required. The longer interval N is, the higher is the bit resolution.

In order to obtain high accuracy, and, in particular, high linearity in A/D converter 100, it is desirable to have the steady state or DC gain of amplifier 200 high. The steady state or DC gain determines the level of voltage $V_{input}$ immediately prior to transmission gate T6 becoming nonconductive, in each period of signal F2. The large DC gain will cause input voltage $V_{input}$ at input terminal 200a of amplifier 200 to remain substantially constant irrespective of the level of analog input signal 160. Also, it is desirable to reduce the Miller effect on the input capacitance at, for example, terminal 200a which capacitance may in fact be non-linear.

FIG. 2 illustrates a detailed schematic diagram of amplifier 200 that is included in, for example, signal integrator 110 of FIG. 1. Similar numerals and symbols in FIGS. 1 and 2 indicate similar items or functions. The circuit of FIG. 2 is constructed using MOS technology that, advantageously, provides high frequency capability with relatively low power consumption.

Input voltage $V_{input}$ at inverting input terminal 200a of amplifier 200 of FIG. 2 is coupled to a gate electrode of a P-type field effect, or PMOS transistor MP1 operating as a an inverting, common source amplifier. The drain electrode of transistor MP1 is coupled to the source electrode of a PMOS transistor MP2 via a junction terminal 200d.

Junction terminal 200d is coupled to a gate electrode of a PMOS transistor MP3 operating as an inverting, common source amplifier. The drain electrode of transistor MP3 is coupled, at a terminal 200e, to the gate electrode of transistor MP2 for varying the gate voltage of transistor MP2. A drain electrode of an N-type field effect, or NMOS transistor MN1, operating as a current source, is coupled to terminal 200e to form a load impedance that determines the voltage gain of transistor MP3. The gate electrode of transistor MN1 is coupled to voltage VREF. Transistors MP1, MP2, MP3 and MN1 form a modified cascode-like arrangement 1200a. Output signal OUT is developed at the drain electrode of transistor MP2. Terminal 200a is the inverting input terminal and terminal 200c is the output terminal of arrangement 1200a.

A change in input voltage $V_{input}$ causes a corresponding change in current $i_1$ flowing through transistors MP1 and MP2 and causes a voltage change at terminal 200e. The signal at terminal 200e that is the amplified signal developed at terminal 200d is fed back via transistor MP2 to terminal 200d. Because of such negative feedback, variations of current $i_1$ caused by changes in voltage $V_{input}$, create significantly smaller voltage variations at terminal 200d than would be created if the gate of transistor MP2 had been maintained constant. In contrast, in, for example, a well known conventional cascode arrangement such negative feedback arrangement is not utilized. The factor by which the voltage variations at terminal 200d become smaller is equal, approximately, to the voltage gain of the common source amplifier comprised of transistors MP3 and MN1. Because the response time of transistors MP2 and of the closed-loop arrangement formed by transistors MP2 and MP3 is fast, the voltage at terminal 200d remains, advantageously, relatively unchanged immediately after an abrupt change occurs in current $i_1$ flowing in transistor MP1.

Because the drain voltage of transistor MP1 at terminal 200d undergoes only slight changes, its drain current $i_1$ is substantially unmodulated by changes in drain voltage of transistor MP2 at terminal 200c. Consequently current $i_1$ that flows also in transistor MP2 is substantially unmodulated by changes in signal OUT at the drain of transistor MP2. Thus, advantageously, the output impedance at terminal 200c is increased by an amount that is proportional to the voltage gain of transistor MP3.

Because of the feedback arrangement formed by transistor MP3 that reduces the variation in the voltage at terminal 200d, the Miller effect on the input capacitance at terminal 200a is, advantageously, even further reduced relative to what it would have been had such negative feedback arrangement not been used. By reducing the Miller effect on the input capacitance, the effective input capacitance is maintained small. Consequently, the effect of any nonlinearlity of the input capacitance that may, otherwise, adversely affect the linearity of, for example, integrator 110 of FIG. 1 is, advantageously, reduced.

As explained before, arrangement 1200a of FIG. 2 that is included in amplifier 200 having input terminal 200a and output terminal 200c is formed by transistors MP1, MP2, MP3 and MN1. In addition to arrangement 1200a, amplifier 200 also includes arrangements 1200b, 1200c and 1200d, each being formed by corresponding four MOS transistors in a similar manner by which arrangement 1200a is formed. The differences between those arrangements and arrangement 1200a are explained below.

Arrangement 1200b includes transistors MP4, MP5, MP6 and MN2 that correspond with transistors MP1, MP2, MP3 and MN1, respectively, of arrangement 1200a. An input terminal 200b of arrangement 1200b that is coupled to the gate of transistor MP4 is at the voltage level of voltage VREF. An output terminal 200f of arrangement 1200b is coupled to the drain electrode of transistor MP5. Because circuits 1200a and 1200b are identical circuit arrangements a current $i_2$ that flows in transistor MP5 is equal to current $i_1$ that flows in transistor MP2 when the voltages at terminals 200a and 200b are equal. Moreover, currents $i_1$ and $i_2$ remain equal when the ambient temperature changes.

Arrangement 1200c includes transistors MN6, MN7, MN8 and MP8 that correspond with transistors MP1, MP2, MP3 and MN1, respectively, of arrangement 1200a; however, each PMOS type transistor in arrangement 1200a, is replaced in arrangement 1200c by an NMOS transistor, and vice versa. Terminal 200f of arrangement 1200b is coupled to the drain electrode of transistor MN7 and to the gate electrode of transistor MN6. Consequently, the gate voltage of transistor MN6 is established at such a level that a current $i_3$ flowing in transistor MN6 becomes equal to current $i_2$. It follows that when the input voltages at terminals 200a and 200b are equal, current $i_3$ is equal to current $i_1$ and, advantageously, tracks temperature caused variations of current $i_1$.

Arrangement 1200d includes transistors MN3, MN4, MN5 and MP7 that correspond with transistors MP1, MP2, MP3 and MN1, respectively, of arrangement 1200a. As in the case of arrangement 1200c, each PMOS type transistor in arrangement 1200a is replaced in arrangement 1200c by an NMOS type transistor, and vice versa. The gate electrode of transistor MN3 is coupled to terminal 200f of arrangement 1200b and 1200c and the drain electrode of transistor MN4 is coupled to output terminal 200c of arrangement 1200a. Consequently, current $i_3$ that flows in transistor MN6 of arrangement 1200c is mirrored in transistor MN3 and is equal to current $i_1$ when the voltages at input terminals 200a and 200b are equal, and advantageously, tracks temperature caused variations of current $i_1$. It follows that arrangements 1200b, 1200c and 1200d cause the offset voltage of amplifier 200 to be approximately or nominally zero in a way that is, advantageously, temperature compensated. Thus, in the close-loop configuration of amplifier 200, such as shown in FIG. 1, voltage $V_{input}$ is equal to voltage VREF, during steady state operation.

Cascode-like arrangement 1200d exhibits high output impedance at terminal 200c that maintains the open loop DC gain of arrangement 1200a, advantageously, high.

Voltage VREF is at a level that provides a sufficient dynamic range to signal OUT of arrangement 1200a of FIG. 2 and a required DC voltage across transistor MP1.

What is claimed:

1. A signal integrator, comprising:
    a source of an input signal;
    a first capacitance;
    a first transmission gate having a control terminal that is responsive to a bilevel, first control signal having a first signal terminal that is coupled to a first terminal of said first capacitance and having a second signal terminal that is coupled to said source of input signal;

an amplifier having a first input terminal and an output terminal;

a second transmission gate having a control terminal that is responsive to a bilevel, second control signal, having a first signal terminal that is coupled to said first input terminal of said amplifier and having a second signal terminal that is coupled to a second terminal of said first capacitance such that said input signal produces a current that is coupled from said source of said input signal to said first input terminal of said amplifier, when both said transmission gates are simultaneously conductive, via the series arrangement of said first transmission gate, said first capacitance and said second transmission gate, said first and second transmission gates being timed to operate in accordance with said first and second control signals, respectively;

an integrating, second capacitance coupled between said first input and output terminals of said amplifier for developing an output signal at said output terminal of said amplifier that is representative of a time integral of said input signal; and means for generating said first and second control signals such that said first control signal is delayed relative to said second control signal for rendering, in a given period of said second control signal, said second transmission gate nonconductive prior to a time when said first transmission gate becomes nonconductive thereby to prevent signal associated with a transition of said first control signal turning off of said first transmission gate from being coupled to said first input terminal of said amplifier.

2. A signal integrator according to claim 1 wherein said second capacitance, coupled between said first input terminal of said amplifier and said output terminal of said amplifier, forms a negative feedback arrangement that causes a voltage developed at said first signal terminal of said second transmission gate to be substantially the same for different levels of said input signal.

3. A signal integrator according to claim 2 further comprising, means for generating a reference voltage that is coupled to said amplifier to cause said voltage that is developed at said first signal terminal of said second transmission gate to be at a level that is midway between the two levels that one of said first and second control signals can assume.

4. A signal integrator according to claim 1 further comprising, means for applying a reference voltage at a second input terminal of said amplifier at a level that is substantially at a midpoint between the two levels that one of said first and second control signals can assume, wherein said second capacitance causes said voltage at said first input terminal of said amplifier to be established, in accordance with said reference voltage, at a level that is substantially equal to that of said reference voltage.

5. A signal integrator according to claim 4 further comprising a third transmission gate coupled between said first terminal of said first capacitance and said reference voltage, and a fourth transmission gate coupled between said second terminal of said first capacitance and said reference voltage and wherein said first capacitance is discharged when both said third and fourth transmission gates are conductive.

6. A signal integrator according to claim 1 further comprising means coupled to said first capacitance for periodically discharging said first capacitance prior to a time, that occurs in each period of one of said first and second control signals that is a periodic signal, when said first and second transmission gates become conductive.

7. A signal integrator according to claim 1 wherein at least one of said first and second transmission gates comprises a pair of complementary MOS transistors that are responsive to complementary control signals.

8. A signal integrator according to claim 1 further comprising, means coupled to said output terminal of said amplifier for generating, in accordance with said output signal of said amplifier, a bilevel, second output signal, a third capacitance having a first terminal that is coupled to said second transmission gate, a third transmission gate having a control terminal that is responsive to a third control signal at a frequency that is related to that of said first frequency, having a first signal terminal that is coupled to said bilevel, second output signal and having a second signal terminal that is coupled to a second terminal of said third capacitance for forming a Sigma-Delta modulator.

9. A signal integrator according to claim 8 wherein said second output signal generating means comprises a comparator responsive to said output signal of said amplifier and digital storage means coupled to an output terminal of said comparator for generating said second output signal at an output terminal of said digital storage means and wherein said digital storage means stores the signal at said output terminal of said comparator simultaneously with a transition edge of said second control signal that renders said second transmission gate nonconductive.

10. A signal integrator according to claim 8 further comprising, means for generating said third control signal such that said third control signal is delayed relative to said second control signal for rendering said second transmission gate nonconductive prior to a time, in said given period of said second control signal, when said third transmission gate becomes nonconductive.

11. A signal integrator according to claim 1 wherein said first and second control signals generating means comprises means for generating a pair of nonoverlapping signals at the same frequency and delay means responsive to one of said pair of nonoverlapping signals for generating, in accordance with the delayed signal of said pair, said first control signal and for generating, in accordance with the undelayed signal of said pair, said second control signal.

12. A signal integrator according to claim 1 wherein said first transmission gate comprises an MOS transistor and wherein said signal that is associated with the turning off of said first transmission gate is generated as a result of a charge that is stored in an inversion layer of said MOS transistor when said MOS transistor is conductive, said charge being coupled to one of said signal terminals of said first transmission gate when a signal transition occurs in said first control signal that renders said first transmission gate nonconductive.

13. A signal integrator according to claim 12 wherein said charge that is coupled to said one of said signal terminals is nonlinearly dependent on said input signal.

14. A signal integrator, comprising:
a source of an input signal;
a first capacitance;

a first transmission gate having a control terminal that is responsive to a bilevel, first control signal, having a first signal terminal that is coupled to a first terminal of said first capacitance and having a second signal terminal that is coupled to said source of input signal;

an amplifier having a first input terminal and an output terminal;

an integrating capacitance coupled between said input and output terminals of said amplifier;

a second transmission gate having a control terminal that is responsive to a bilevel, second control signal, having a first signal terminal that is coupled to said first input terminal of said amplifier and having a second signal terminal that is coupled to a second terminal of said first capacitance such that said input signal produces a current that is coupled from said source of said input signal to said first input terminal of said amplifier, when both said transmission gates are simultaneously conductive, via the series arrangement of said first transmission gate, said first capacitance and said second transmission gate, said first and second transmission gates operating at timings that are controlled in accordance with said first and second control signals, respectively; and means for generating said first and second control signals for alternately rendering and transmission gates conductive and non-conductive, wherein said first and second control signals have substantially the same frequency, duty cycle and phases but the phase of the second control signal is advanced relative to said first control signal to render said second transmission gate nonconductive sufficiently in advance of a time when said first control signal renders said first transmission gate nonconductive to preclude nonlinearities in a signal that is associated with the switching of said first transmission gate from propagating-through said second transmission gate to said amplifier.

15. A signal integrator according to claim 14 further comprising, an integrating, second capacitance coupled between said first input and output terminals of said amplifier for developing a output signal at said output terminal of said amplifier that is representative of a time integral of said input signal.

16. A signal integrator, comprising:

a source of an input signal;

a first capacitance having a first terminal that is coupled to said source of said input signal;

an amplifier having a first input terminal and an output terminal;

a first transmission gate having a control terminal that is responsive to a bilevel, first control signal, having a first signal terminal that is coupled to said first input terminal of said amplifier and having a second signal terminal that is coupled to a second terminal of said first capacitance such that said input signal is coupled to said first input terminal of said amplifier via said first transmission gate and via said first capacitance;

an integrating, second capacitance coupled between said first input and output terminals of said amplifier for developing an output signal at said output terminal of said amplifier that is representative of a time integral of said input signal; and means for generating a reference voltage that is coupled to said first signal terminal of said first transmission gate having a value that is midway between the two levels that said first control signal can assume.

17. A signal integrator according to claim 16 wherein said reference voltage is coupled to a second input terminal of said amplifier and wherein said reference voltage is substantially at said level that is midway between the two levels of said first control signal.

18. A signal integrator according to claim 16 wherein said amplifier operates as a differential amplifier such that said first and second input terminals of said amplifier form an inverting terminal and an noninverting input terminal, respectively.

19. A signal integrator, according to claim 16 further comprising, a second transmission gate having a control terminal that is responsive to a bilevel, second control signal, having a first signal terminal that is coupled to a first terminal of said first capacitance and having a second signal terminal that is coupled to said source of input signal and means for generating said first and second control signals, wherein said input signal is coupled to said first input terminal of said amplifier via the series arrangement of said first transmission gate, said first capacitance and said second transmission gate, when both said first and second transmission gates are conductive and such that said input signal is decoupled, when at least said first transmission gate is nonconductive, said first and second transmission gates operating at timings that are controlled in accordance with said first and second control signals, respectively, and wherein said first and second control signals have substantially the same frequency and duty cycle but the phase of the second control signal is advanced relative to said first control signal to render said second transmission gate nonconductive sufficiently in advance of a time when said first control signal renders said first transmission gate nonconductive to preclude nonlinearities in a signal that is associated with the switching of said first transmission gate from propagating-through said second transmission gate to said amplifier.

* * * * *